(12) United States Patent
Park

(10) Patent No.: US 8,217,484 B2
(45) Date of Patent: Jul. 10, 2012

(54) IMAGE SENSOR AND METHOD OF FABRICATING THE SAME

(75) Inventor: Byung Jun Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 189 days.

(21) Appl. No.: 12/659,958

(22) Filed: Mar. 26, 2010

(65) Prior Publication Data

US 2010/0244175 A1 Sep. 30, 2010

(30) Foreign Application Priority Data

Mar. 27, 2009 (KR) ........................ 10-2009-0026600

(51) Int. Cl.
*H01L 31/00* (2006.01)
*H01L 29/417* (2006.01)
*H01L 29/74* (2006.01)
*H01L 31/111* (2006.01)
*H01L 27/10* (2006.01)
*H01L 23/48* (2006.01)
*H01L 23/52* (2006.01)
*H01L 29/40* (2006.01)

(52) U.S. Cl. ........ 257/459; 257/113; 257/211; 257/758; 257/E21.016; 257/E21.575; 257/E21.627; 257/E21.641; 257/E31.113

(58) Field of Classification Search ................. 257/113, 257/211, 459, 758, E21.016, E21.575, E21.627, 257/E21.641, E31.113
See application file for complete search history.

(56) References Cited

U.S. PATENT DOCUMENTS

| | | | |
|---|---|---|---|
| 7,268,369 B2 * | 9/2007 | Araki .............................. | 257/83 |
| 7,518,172 B2 * | 4/2009 | Moon et al. ................... | 257/292 |
| 7,535,073 B2 * | 5/2009 | Ezaki ............................ | 257/440 |
| 7,541,212 B2 * | 6/2009 | Oh ................................. | 438/48 |
| 7,564,079 B2 * | 7/2009 | Mabuchi et al. .............. | 257/229 |
| 7,582,503 B2 * | 9/2009 | Abe et al. ........................ | 438/65 |
| 7,592,644 B2 * | 9/2009 | Suzuki et al. ................. | 257/184 |
| 7,619,269 B2 * | 11/2009 | Ohkawa ........................ | 257/296 |
| 8,003,425 B2 * | 8/2011 | Adkisson et al. .............. | 438/65 |
| 8,003,428 B2 * | 8/2011 | Barrett et al. .................. | 438/70 |
| 2009/0078974 A1 * | 3/2009 | Nagai et al. .................... | 257/292 |
| 2009/0206432 A1 * | 8/2009 | Kim et al. ...................... | 257/432 |
| 2011/0237014 A1 * | 9/2011 | Hiyama et al. ................. | 438/60 |

FOREIGN PATENT DOCUMENTS

| | | |
|---|---|---|
| JP | 2001-127276 | 5/2001 |
| JP | 2005-353955 | 12/2005 |
| JP | 2006-032497 | 2/2006 |

* cited by examiner

*Primary Examiner* — Ida M Soward
(74) *Attorney, Agent, or Firm* — Harness, Dickey & Pierce, P.L.C.

(57) ABSTRACT

The image sensor includes a substrate; a wiring structure formed on a front side of the substrate and including a plurality of wiring layers and a plurality of insulating films; a first well formed within the substrate and having a first conductivity type; and a first metal wiring layer directly contacting a backside of the substrate and configured to apply a first well bias to the first well.

17 Claims, 18 Drawing Sheets

IMAGE SENSOR AND METHOD OF FABRICATING THE SAME

CROSS-REFERENCE TO RELATED APPLICATION

This application claims priority under U.S.C. §119 to Korean Patent Application No. 10-2009-0026600, filed on Mar. 27, 2009, in the Korean Intellectual Property Office (KIPO), the entire contents of which are incorporated herein by reference.

BACKGROUND

1. Field

Example embodiments of the inventive concepts relate to an image sensor and a method of fabricating the same.

2. Description of the Related Art

Image sensors convert an optical image into an electrical signal. With recent advancements in computer and communication industries, the demands for image sensors with enhanced performance are increasing in various fields such as digital cameras, camcorders, personal communication systems, game devices, security cameras, micro-cameras for medical use, and robots.

Metal oxide semiconductor (MOS) image sensors can be driven using a simple driving method and can be implemented using various scanning methods. In MOS image sensors, signal-processing circuits can be integrated onto a single chip. Thus, the size of a product including such a MOS image sensor can be reduced. In addition, since MOS image sensors are compatible with MOS processing technology, manufacturing costs can be reduced. Due to their low power consumption, MOS image sensors can be applied in products with limited battery capacity. That is, technological development accompanied by achievement of high resolution is sharply increasing the use of MOS image sensors.

A MOS image sensor includes photoelectric conversion elements, which sense the amount of incident light, and a plurality of metal wiring layers which output an optical signal stored in each of the photoelectric conversion elements. In this case, however, incident light may be reflected by the metal wiring layers or absorbed by an interlayer insulating film, thereby reducing sensitivity. In addition, the reflected light may be absorbed by adjacent pixels, thereby causing crosstalk.

In this regard, an image sensor having a structure, in which a backside of a substrate is ground and light is incident from the backside of the substrate, has been suggested. Such an image sensor is called a backside illuminated (BI) image sensor. In a BI image sensor, metal wiring layers are not formed on a backside of a substrate upon which light is incident. Therefore, incident light is not reflected by the metal wiring layers or absorbed by an interlayer insulating film.

SUMMARY

The present inventive concepts provide an image sensor and method of fabricating the same which can maintain the potentials of wells in a relatively stable manner.

According to an example embodiment of the present inventive concepts, an image sensor includes a substrate; a wiring structure formed on a front side of the substrate and including a plurality of wiring layers and a plurality of insulating films; a first well formed within the substrate and having a first conductivity type; and a first metal wiring layer directly contacting a backside of the substrate and configured to apply a first well bias to the first well.

According to another example embodiment of the present inventive concepts, an image sensor includes a sensing region, a peripheral region, and a pad region defined within a substrate; photoelectric conversion elements formed in the sensing region; a first well formed in the peripheral region and having a first conductivity type; a wiring structure formed on a front side of the substrate and including a plurality of wiring layers and a plurality of insulating films; a first pad formed on a backside of the substrate in the pad region and receiving a first well bias; and a first metal wiring layer formed on the backside of the substrate in the peripheral region and electrically connected to the first pad to deliver the first well bias from the first pad to the first well.

According to another example embodiment of the present inventive concepts, there is provided a method of fabricating an image sensor. The method includes forming a first well within a substrate, the first well having a first conductivity type; forming a wiring structure on a front side of the substrate, the wiring structure including a plurality of wiring layers and a plurality of insulating films; and forming first metal wiring layer directly contacting a backside of the substrate and configured to apply a first well bias to the first well.

According to another example embodiment of the present inventive concepts, the method includes providing a sensing region, a peripheral region, and a pad region defined within a substrate; forming a first well within the substrate in the peripheral region, the first well having a first conductivity type; forming a wiring structure on a front side of the substrate, the wiring structure including a plurality of wiring layers, a plurality of insulating films, and an auxiliary pad; forming a backside insulating film on a backside of the substrate, exposing the auxiliary pad in the pad region by forming a contact hole, the contact hole configured to penetrate the backside insulating film and the substrate, exposing at least part of the backside of the substrate in the peripheral region by patterning the backside insulating film in the peripheral region, forming a contact in the contact hole, the contact being electrically connected to the auxiliary pad and forming a pad in the pad region and the first metal wiring layer in the peripheral region, the pad being electrically connected to the contact on the substrate in the region.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION OF EXAMPLE EMBODIMENTS

Figure 1A:
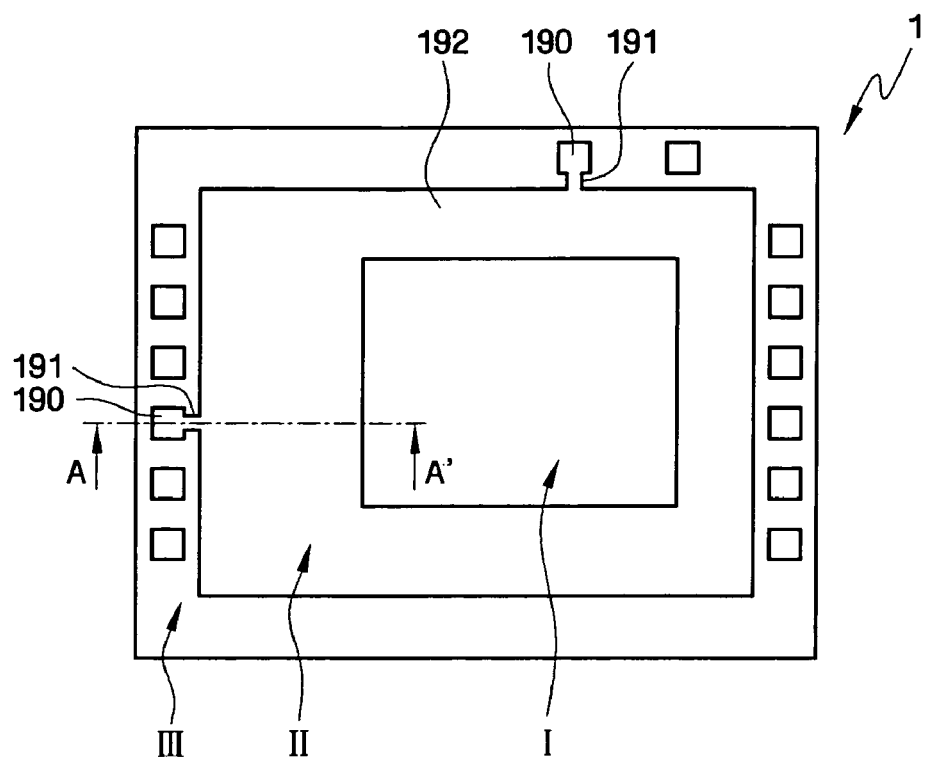
FIG. 1A is a view showing the relationship between first pads and a first metal wiring layer included in an image sensor according, to an example embodiment of the present invention.

Advantages and features of the present invention and methods of accomplishing the same may be understood more readily by reference to the following detailed description of example embodiments and the accompanying drawings. The present invention may, however, be embodied in many different forms and should not be construed as being limited to the example embodiments set forth herein. Rather, these embodiments are provided so that this disclosure will be thorough and complete and will fully convey the concept of the invention to those skilled in the art. In the drawings, sizes and relative sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one device or element's relationship to another device(s) or element(s) as illustrated in the drawings. It will be understood that the spatially relative terms are intended to encompass different orientations of the device in use or operation in addition to the orientation depicted in the drawings. Like numbers refer to like elements throughout.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes", and/or "including" when used in this application, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Example embodiments of the invention are described herein with reference to (plan and) cross-section illustrations that are schematic illustrations of idealized embodiments of the invention. As such, variations from the shapes of the illustrations as a result, for example, of manufacturing techniques and/or tolerances, are to be expected. Thus, example embodiments of the invention should not be construed as limited to the particular shapes of regions illustrated herein but are to include deviations in shapes that result, for example, from manufacturing. Thus, the elements illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, example embodiments of the present invention will be described in detail with reference to the attached drawings.

Figure 1B:
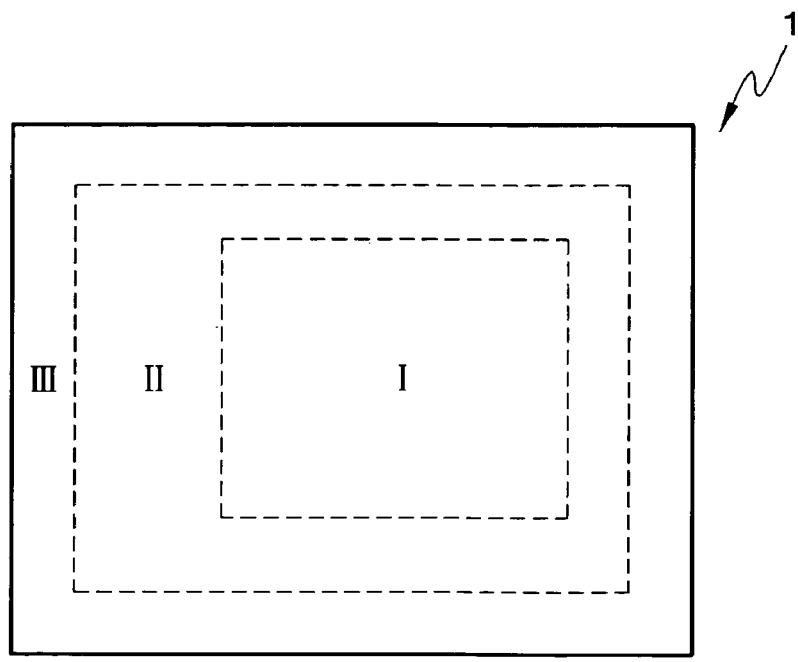
FIG. 1B is a view showing a substrate used in the image sensor according to the example embodiment of the present invention.
Figure 2:
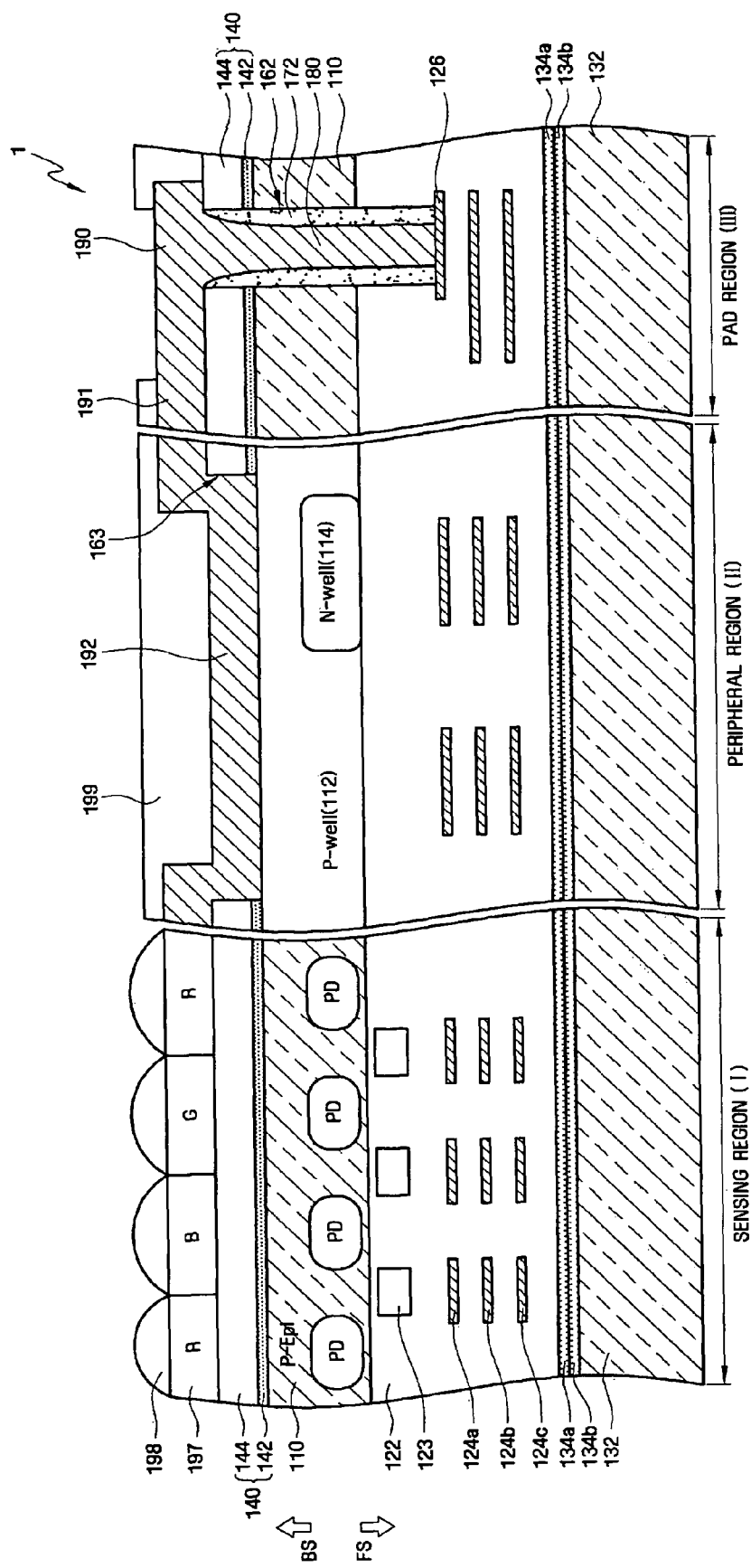
FIG. 2 is a cross-sectional view of the image sensor taken along the line A-A' of FIG. 1A.

FIGS. 1A through 4B are views showing an image sensor 1 according to an example embodiment of the present invention. Specifically, FIG. 1A is a view showing the relationship between first pads 190 and a first metal wiring layer 192 included in the image sensor 1 according to the example embodiment of the present invention. FIG. 1B is a view showing a substrate 110 used in the image sensor 1 according to the example embodiment of the present invention. FIG. 2 is a cross-sectional view of the image sensor 1 taken along the line A-A' of FIG. 1A. FIGS. 3A through 4B are views for explaining a method of maintaining the potentials of wells included in the image sensor 1 according to the example embodiment of the present invention. FIG. 4C is a view showing an image sensor according to an example embodiment of the present invention.

Referring to FIG. 2, a charge transmission element, a drive element, a reset element, and a selection element may be formed in a sensing region I. In addition, a complementary metal oxide semiconductor (CMOS) element formed at the same time as a read element, a resistive element, and a capacitor may be provided in a peripheral region II. The above elements can be implemented in various forms that are widely known to those of ordinary skill in the art. Thus, the above elements will not be disclosed or described using reference numerals in order to avoid ambiguous interpretation of the present invention.

Referring to FIGS. 1A through 2, the sensing region I, the peripheral region II, and a pad region III are defined in the substrate 110. A plurality of unit pixels are formed in the sensing region I, a circuit for controlling the unit pixels is formed in the peripheral region II, and a plurality of pads are formed in the pad region III. Referring to FIG. 1B, the peripheral region II surrounds the sensing region I, and the pad region III surrounds the peripheral region II. However, the present invention is not limited thereto. For example, the peripheral region II may not surround the sensing region I, and the pad region III may be formed only on a side of the peripheral region II.

Photoelectric conversion elements, e.g., photodiodes PDs, may be formed in the substrate 110 of the sensing region I, and a plurality of gates 123 may be disposed on the substrate 110. Each of the gates 123 may be a gate of a charge transmission element, a gate of a reset element, or a gate of a drive element. Various types of substrates may be used as the substrate 110. For example, the substrate 110 may be a P- or N-type bulk substrate, a substrate formed by growing a P- or N-type epitaxial layer on a P-type bulk substrate, or a substrate formed by growing a P- or N-type epitaxial layer on an N-type bulk substrate. In addition, the substrate 110 may not necessarily be a semiconductor substrate but may also be, e.g., an organic plastic substrate. The substrate 110 shown in FIG. 2 includes only an epitaxial layer that remains after the whole of a bulk substrate is removed in a grinding process which will be described later with reference to FIG. 15. However, the present invention is not limited thereto. That is, when necessary, part of the bulk substrate may not be removed. The thickness of the substrate 110, which remains after the grinding process, may be, but is not limited to, about 3 to 5 µm.

A first well 112 of a first conductivity type (e.g., a P type) and a second well 114 of a second conductivity type (e.g., an N type) may be formed within the substrate 110 in the peripheral region II. The dispositions, shapes, and concentrations of the first and second wells 112 and 114 may vary.

A wiring structure is disposed on a front side FS of the substrate 110. The wiring structure includes a plurality of interlayer insulating films 122, a plurality of wiring layers 124a through 124c which are formed in the sensing region I and the peripheral region II and are sequentially stacked, and an auxiliary pad 126 which is formed in the pad region III. The wiring layers 124a through 124c may be made of metal such as aluminum or copper. The auxiliary pad 126 may be at the same level as the wiring layer 124a which is the lowest of all the wiring layers 124a through 124c. When necessary, the auxiliary pad 126 may be at the same level as the wiring layer 124b or 124c which is the second or third lowest of the wiring layers 124a through 124c. The auxiliary pad 126 and the wiring layer 124a, which is at the same level as the auxiliary pad 126, may be made of the same material.

A support substrate 132 is bonded and fixed onto the wiring structure (i.e., the interlayer insulating films 122, the wiring layers 124a through 124c, and the auxiliary pad 126). The support substrate 132 is implemented to secure the strength of the substrate 110 which was made thinner in the grinding process. The support substrate 132 may not necessarily be a semiconductor substrate but may also be any substrate made of a material that can maintain the substrate's mechanical strength. For example, the support substrate 132 may be a silicon substrate or a glass substrate.

To bond the support substrate 132 to the wiring structure, first and second adhesive films 134a and 134b may be interposed between the support substrate 132 and the wiring structure. When the support substrate 132 is a silicon substrate, the first and second adhesive films 134a and 134b may be, e.g., silicon oxide films. A backside insulating film 140 may be disposed on a backside BS of the substrate 110. The backside insulating film 140 may include a reflection reducing film 142 and a buffer film 144.

The material/thickness of the reflection reducing film 142 may vary according to a wavelength of light used in a photo process. The reflection reducing film 142 may be formed by stacking, e.g., a silicon oxide film having a thickness of about 50 to 200 Å and a silicon nitride film having a thickness of about 300 to 500 Å. The buffer film 144 is disposed on the reflection reducing film 142. The buffer film 144 prevents or reduces damage to the substrate 110 during a patterning process performed to form the first pads 190. The buffer film 144 may be a silicon oxide film having a thickness of about 3,000 to 8,000 Å.

Color filters 197 and microlenses 198 may be disposed on the backside BS of the substrate 110 in the sensing region I. The color filters 197 and the microlenses 198 are formed at locations corresponding to the photoelectric conversion elements (e.g., photodiodes PDs). Although not shown in the drawing, a planarization film may be formed between the color filters 197 and the microlenses 198 or under the color filters 197.

The first pads 190 may be disposed on the backside BS of the substrate 110 in the pad region III. Each of the first pads 190 is electrically connected to the auxiliary pad 126 by a contact 180 which penetrates the backside insulating film 140 and the substrate 110. A contact hole 162 may penetrate the backside insulating film 140 and the substrate 110 to expose the auxiliary pad 126. A spacer 172 is formed on sidewalls of the contact hole 162 to prevent or reduce electrical connection between the contact 180 and the substrate 110 (that is, to prevent or reduce the contact 180 and the substrate 110 from short-circuiting). As shown in FIG. 2, the contact 180 may fill the contact hole 162 or may be conformally formed along the spacer 172. The contact 180 may have any form as long as it can connect the auxiliary pad 126 to each of the first pads 190.

The first metal wiring layer 192 may be formed on the backside BS of the substrate 110 in the peripheral region II. The first metal wiring layer 192 may directly contact the backside BS (or the first well 112) of the substrate 110. A first well bias is applied to the first well 112 through the first metal wiring layer 192, and the potential of the first well 112 is maintained at a specified level. For example, when the first well 112 is of a P type, the first well bias may be a ground voltage GND. Unlike the illustration in FIG. 2, when the first well 112 is of an N type, the first well bias may be a power supply voltage VDD (see FIG. 4C).

A trench 163 is formed in the backside insulating film 140 to expose at least part of the backside BS of the substrate 110 in the peripheral region II. As shown in FIG. 2, the first metal wiring layer 192 may be conformally formed on a top surface of the backside insulating film 140, sidewalls of the backside insulating film 140 (i.e., sidewalls of the trench 163), and a portion of the backside BS of the substrate 110 which is exposed by the trench 163. In addition, as shown in FIGS. 1A and 1B, the first metal wiring layer 192 may overlap almost the entire peripheral region II. A passivation film 199 may expose each of the first pads 190 and cover the first metal wiring layer 192.

The first metal wiring layer 192 may be electrically connected to each of the first pads 190. Referring to FIGS. 1A and 2, the first metal wiring layer 192 and each of the first pads 190 may be connected to each other by a connection portion 191. The connection portion 191 may extend from each of the first pads 190 to directly contact the first metal wiring layer 192. To put it another way, the connection portion 191 may be formed at the same wiring level as each of the first pads 190. The connection portion 191, the first metal wiring layer 192, and the first pads 190 may be made of the same material and may be simultaneously formed by the same process.

In the image sensor 1 according to an example embodiment, the first well bias is applied to the first well 112 from the backside BS of the substrate 110 (that is, through the first metal wiring layer 192 formed on the backside BS of the substrate 110). The first well bias is applied from an external source to each of the first pads 190 and delivered to the first well 112 via the connection portion 191 and the first metal wiring layer 192. In this configuration, the image sensor 1 according to the example embodiment can maintain the potential of the first well 112 in a more stable manner, which will now be described in detail with reference to FIGS. 3A through 4B.

Figure 3A:
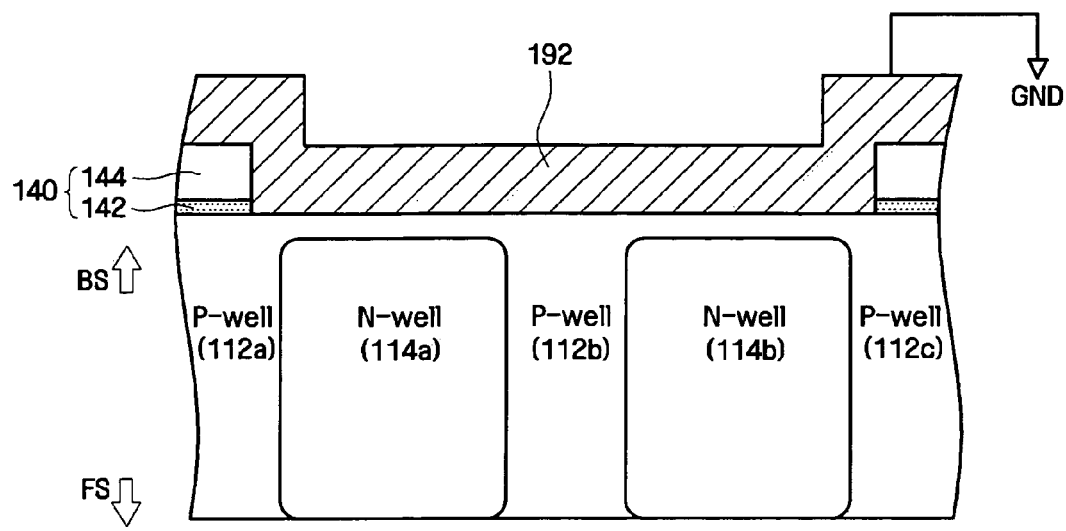
FIGS. 3A through 4B are views for explaining a method of maintaining the potentials of wells included in the image sensor according to an example embodiment of the present invention.
Figure 3B:
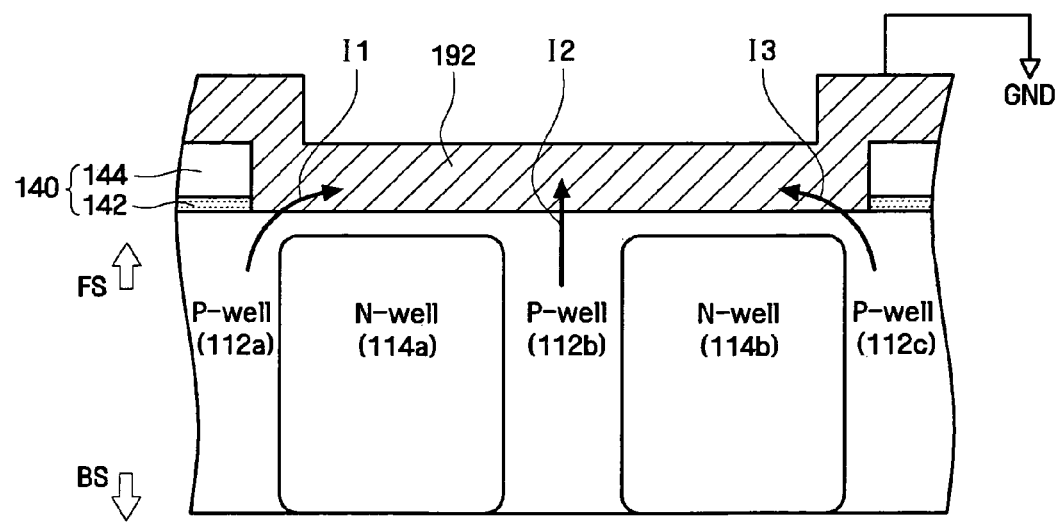
Figure 4A:
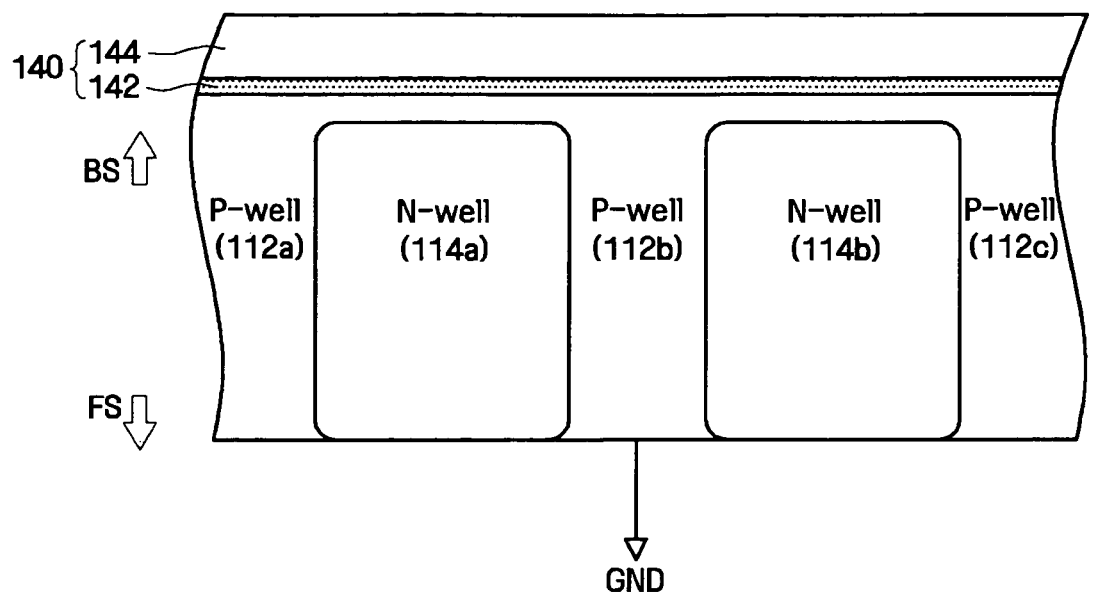
FIG. 4C is a view showing an image sensor according to an example embodiment of the present invention.
Figure 4B:
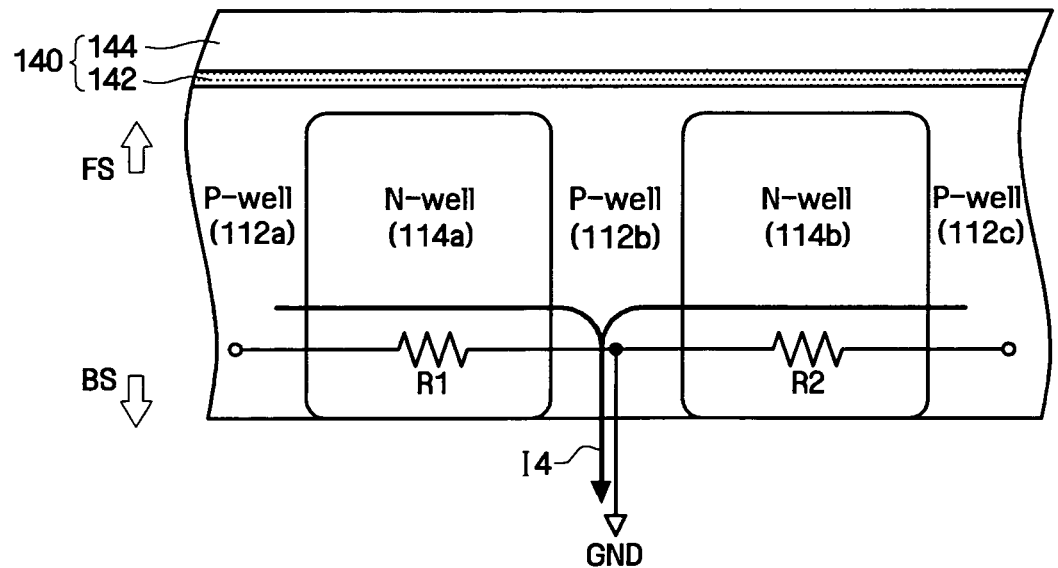

FIGS. 3A and 3B are views illustrating the first well bias being applied from the backside BS of the substrate 110, like in the image sensor 1 according to the example embodiment of the present invention. FIGS. 4A and 4B are views illustrating the first well bias being applied from the front side FS of the substrate 110, unlike in the image sensor 1 according to the example embodiment of the present invention. In FIGS. 3A through 4B, second wells 114a and 114b of a second conductivity type are formed between first wells 112a through 112c of a first conductivity type in the peripheral region II.

Referring to FIGS. 3A and 3B, the backside BS of the substrate 110 is relatively less complicated than the front side FS of the substrate 110, and the complicated wiring layers 124a through 124c are not formed on the backside BS of the substrate 110. A backside insulating film 140 may be disposed on a backside BS of the substrate 110. The backside insulating film 140 may include a reflection reducing film 142 and a buffer film 144.

Therefore, the first metal wiring layer 192 may contact the backside BS of the substrate 110 and overlap almost the entire backside BS of the substrate 110 in the peripheral region II. In addition, since the complicated wiring layers 124a through 124c are not formed on the backside BS of the substrate 110, the first metal wiring layer 192 can be easily formed to contact desired portions of the first wells 112a through 112c. Accordingly, the first well bias can be smoothly applied to each of the first wells 112a through 122c through the first metal wiring layer 192. Consequently, a current I1 may flow from the first well 112a to the first metal wiring layer 192, a current I2 may flow from the first well 112b to the first metal wiring layer 192, and a current I3 may flow from the first well 112c to the first metal wiring layer 192. Although the first wells 112a through 112c are separated from each other by the second wells 114a and 114b, their potentials can be more stably maintained. A ground voltage GND is applied from an external source and delivered to the first well via the first metal wiring layer 192.

Referring to FIGS. 4A and 4B, the wiring structure, which includes the complicated wiring layers 124a through 124c, is formed on the front side FS of the substrate 110 (see FIG. 2). Thus, an additional region is required to allow the first well bias to be applied from the front side FS of the substrate 110 to the first wells 112a through 112c. Here, the first well bias may not be separately applied to each of the first wells 112a through 112c in order to reduce the size of the additional region. Accordingly, as shown in FIGS. 4A and 4B, a current I4 may flow from the first wells 112a and 112c and through the second wells 114a and 114b of a second conductivity. Since the second wells 114a and 114b function as resistors R1 and R2, the first well bias is not smoothly delivered to the first wells 112a and 112c. Therefore, the potentials of the first wells 112a and 112c are not stable, compared with the potential of the first well 112b.

Figure 4C:
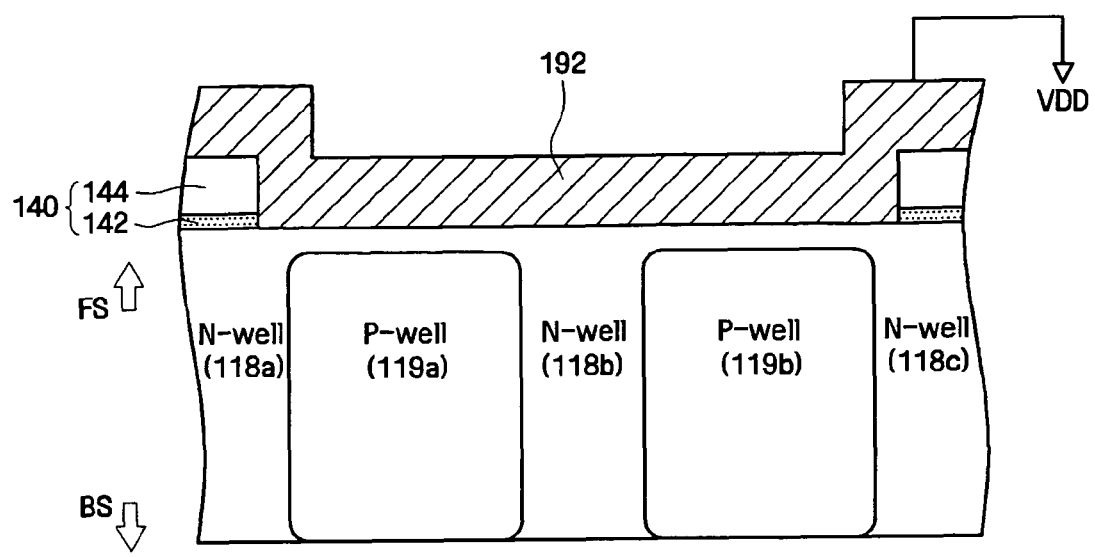

In particular, when the substrate 110 includes only an epitaxial layer that remains after a bulk substrate is removed (that is, when the substrate 110 is thin), it is more difficult for the current I4 to be delivered to the first wells 112a and 112c. In this case, the potentials of the first wells 112 and 112c are even more unstable, compared with the potential of the first well 112b. Referring to FIG. 4C, when first wells 118a through 118c are of an N type, the first well bias may be the power supply voltage VDD. The first wells 118a through 118c may be separated from each other by second wells 119a and 119b. The power supply voltage VDD may be applied to the first wells 118a through 118c through the first metal wiring layer 192.

Figure 5:
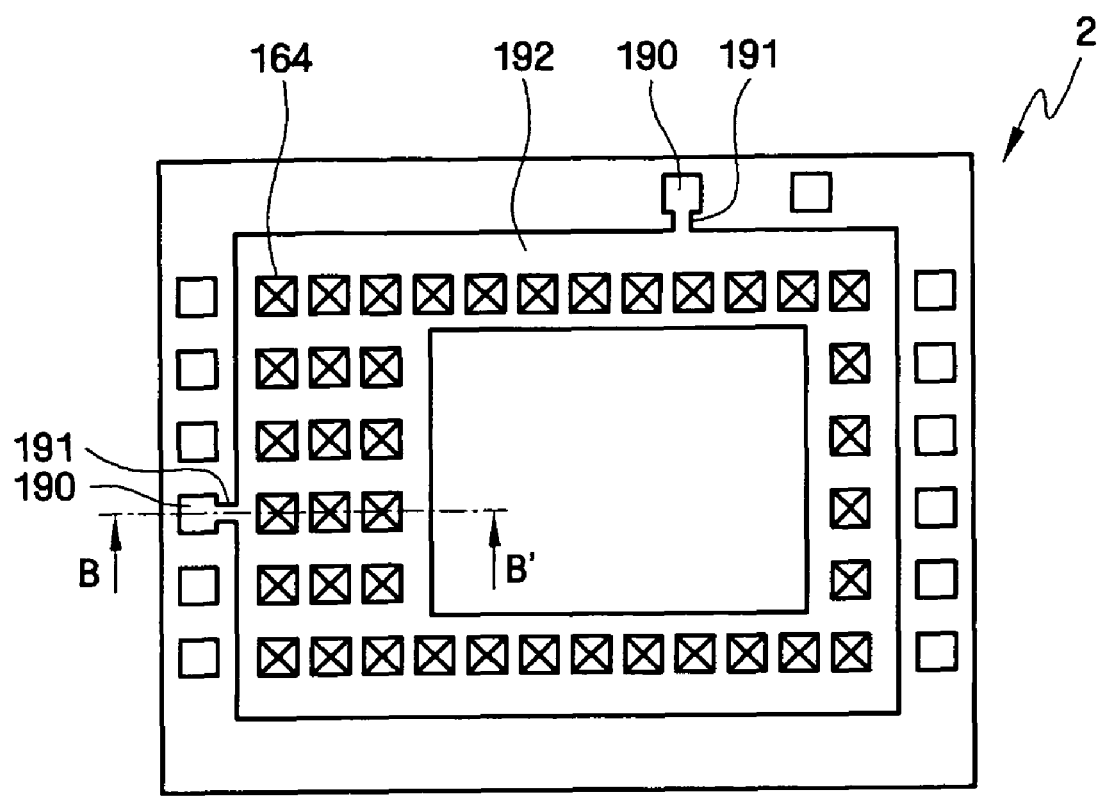
FIG. 5 is a view showing the relationship between first pads and a first metal wiring layer included in an image sensor according to another example embodiment of the present invention.
Figure 6:
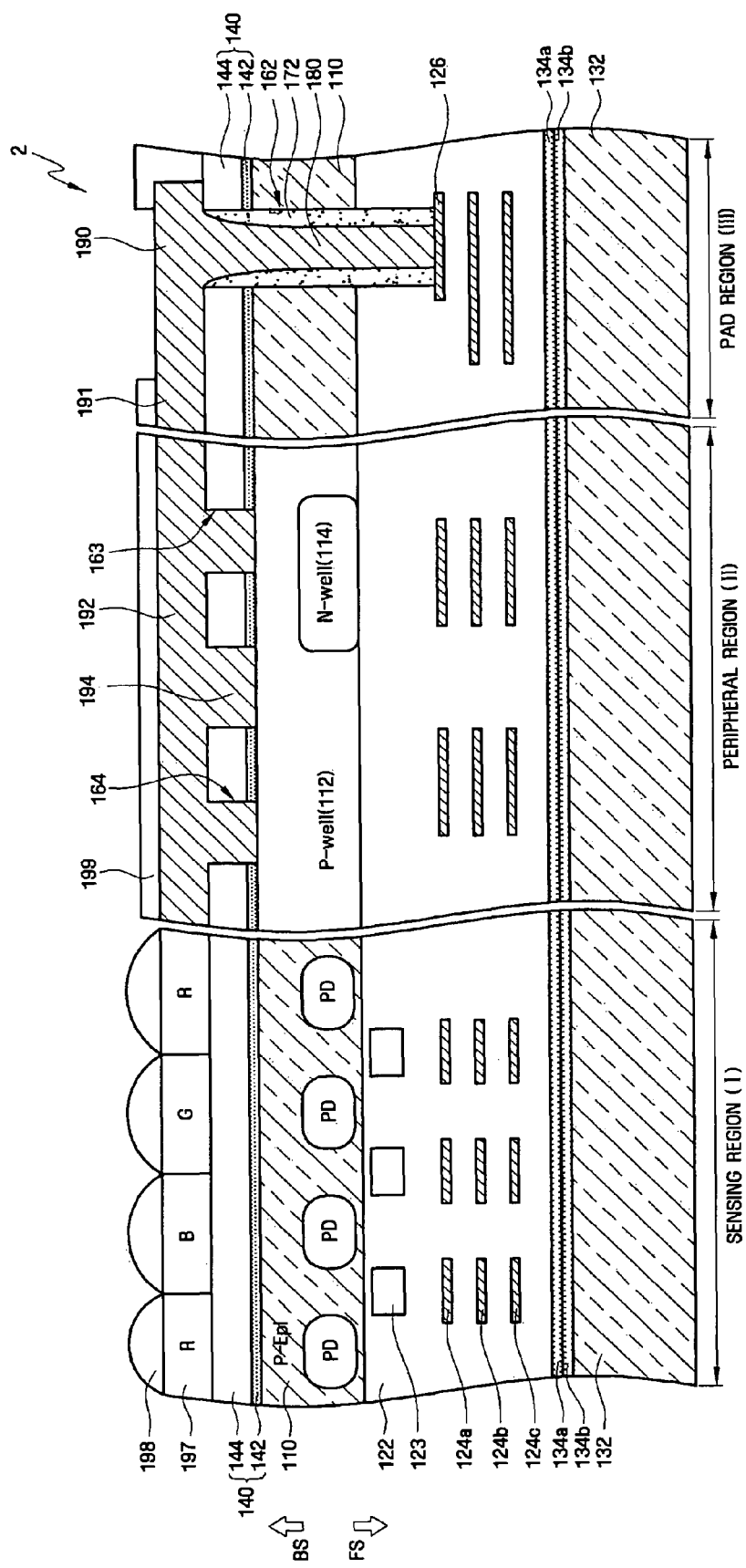
FIG. 6 is a cross-sectional view of the image sensor taken along the line B-B' of FIG. 5.

FIGS. 5 and 6 are views showing an image sensor 2 according to an example embodiment of the present invention. FIG. 5 is a view showing the relationship between first pads 190 and a first metal wiring layer 192 included in the image sensor 2 according to the example embodiment of the present invention. FIG. 6 is a cross-sectional view of the image sensor 2 taken along the line B-B' of FIG. 5.

Referring to FIGS. 5 and 6, a backside insulating film 140 used in the image sensor 2 according to the example embodiment includes a plurality of through-holes 164 which expose a backside BS of a substrate 110 in a peripheral region II. The first metal wiring layer 192 fills the through-holes 164 (that is, a plurality of contacts 194 are respectively formed in the through-holes 164) to contact the backside BS of the substrate 110. The number of the through-holes 164 and the positions of the through-holes 164 are not limited to those shown in FIGS. 5 and 6.

Figure 7:
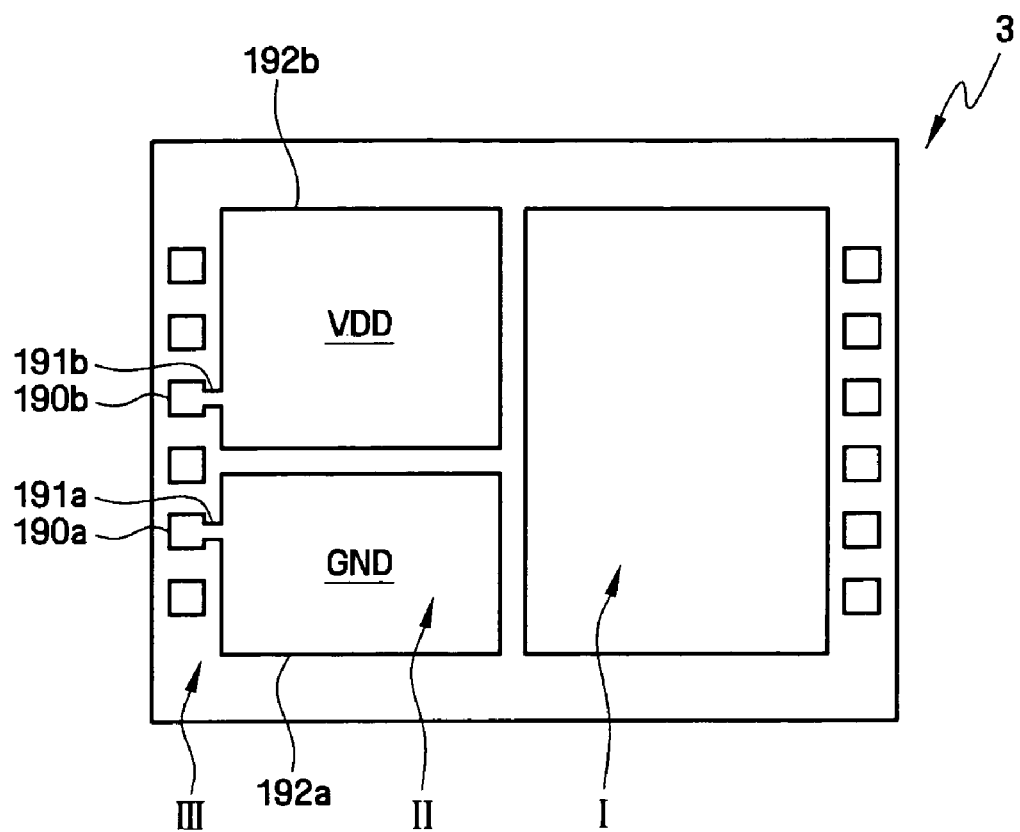
FIG. 7 is a view showing an image sensor according to another example embodiment of the present invention.

FIG. 7 is a view showing an image sensor 3 according to an example embodiment of the present invention. Referring to FIG. 7, the image sensor 3 according to the example embodiment includes a first well of a first conductivity type and a second well of a second conductivity type which is different from the first conductivity type. The first and second wells are formed in a substrate of a peripheral region II. A first pad 190a and a second pad 190b are formed on a backside of the substrate in a pad region III.

In this case, a first metal wiring layer 192a is formed on the backside of the substrate to directly contact the first well. In addition, the first pad 190a and the first metal wiring layer 192a are connected to each other by a connection portion 191a, and the connection portion 191a extends from the first pad 190a to directly contact the first metal wiring layer 192a. When the first well is doped with P-type impurities, a first well bias (e.g., a ground voltage GND) may be applied to the first well. The ground voltage GND is applied from an external source to the first pad 190a and delivered to the first well via the connection portion 191a and the first metal wiring layer 192a.

A second metal wiring layer 192b is separated from the first metal wiring layer 192a and is formed on the backside of the substrate to directly contact the second well. In addition, the second pad 190b and the second wiring layer 192b are connected to each other by a connection portion 191b, and the connection portion 191b extends from the second pad 190b to directly contact the second metal wiring layer 192b. When the second well is doped with N-type impurities, a second bias (e.g., a power supply voltage VDD) may be applied to the second well. The power supply voltage VDD is applied from an external source to the second pad 190b and delivered to the second well via the connection portion 191b and the second metal wiring layer 192b.

Figure 8:
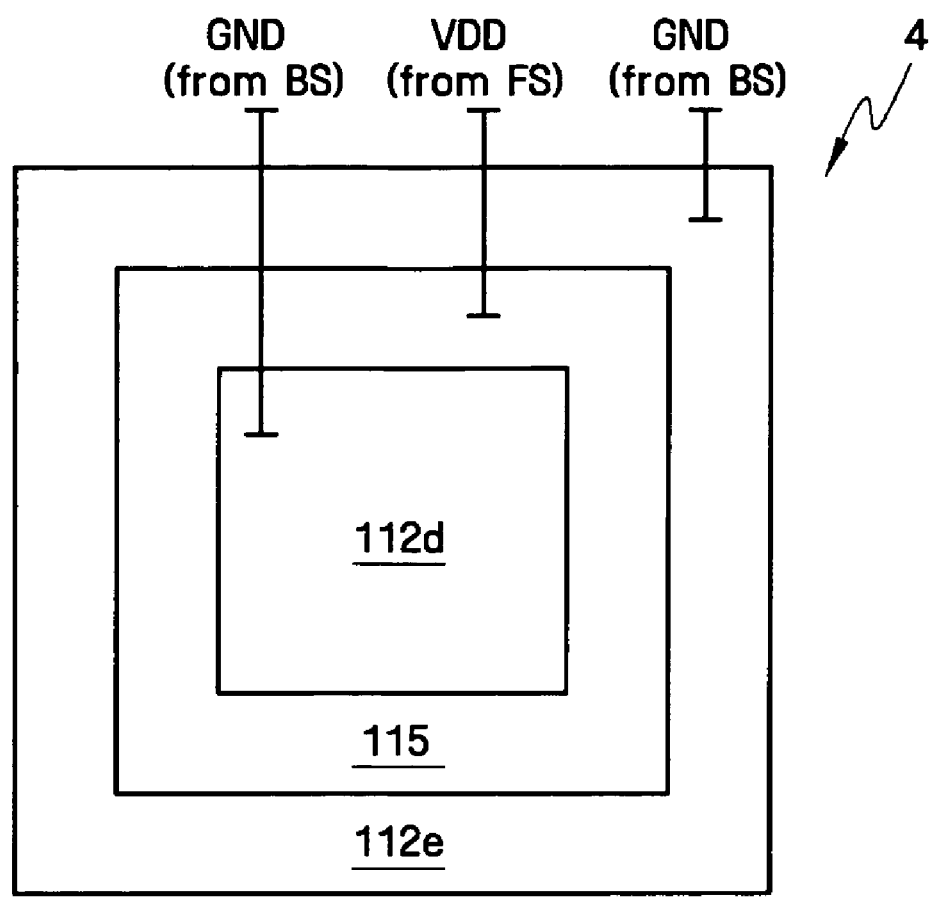
FIG. 8 is a view showing an image sensor according to another example embodiment of the present invention.

FIG. 8 is a view showing an image sensor 4 according to an example embodiment of the present invention. Referring to FIG. 8, the image sensor 4 according to the example embodiment includes a plurality of wells in a substrate of a peripheral region II. A well bias is applied from a backside of the substrate to some of the wells, and the well bias is applied from a front side of the substrate to some of the wells. As shown in FIG. 8, first wells 112d and 112e of a first conductivity type and a third well 115 of a second conductivity type which is different from the first conductivity type may be formed in the substrate of the peripheral region II.

In particular, the third well 115 may surround the first well 112d, and the first well 112e may surround the third well 115. In this case, a first well bias (e.g., a ground voltage GND) may be applied from a backside of the substrate to the first wells 112d and 112e, and a third well bias (e.g., a power supply voltage VDD) may be applied from a front side of the substrate to the third well 115. A wiring structure (i.e., the interlayer insulating films 122, the wiring layers 124a through 124c, and the auxiliary pad 126) formed on the front side of the substrate may include a third metal wiring layer used to apply the third well bias to the third well 115.

Figure 9:
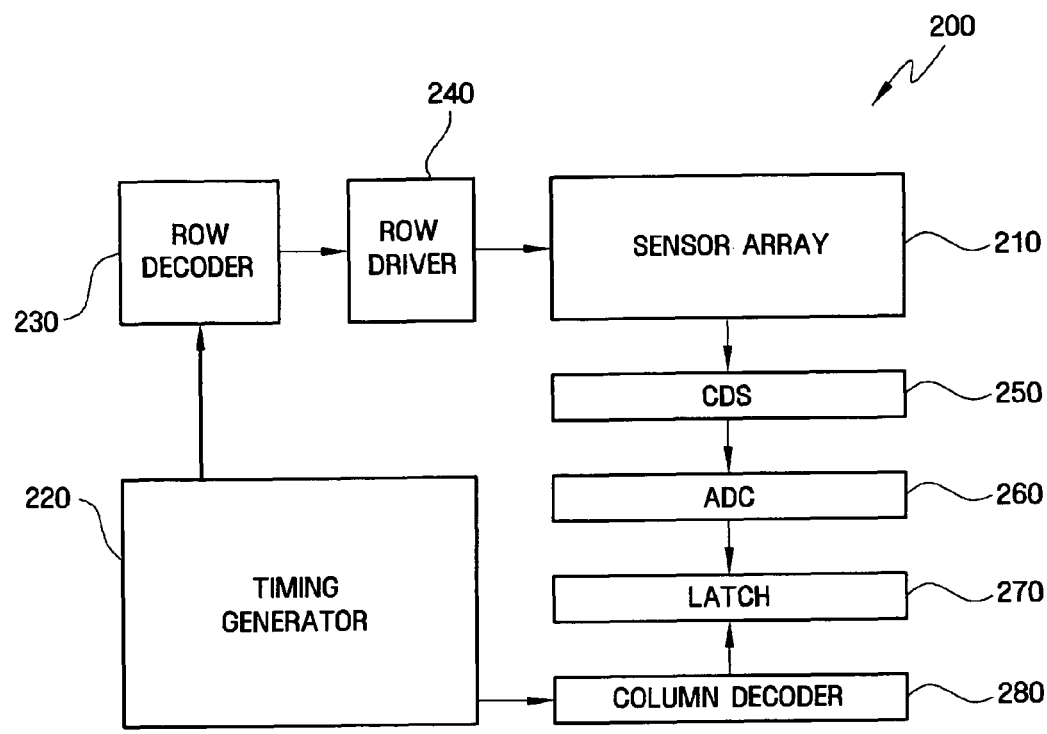
FIG. 9 is a block diagram of a chip which embodies an image sensor according to example embodiments of the present invention.
Figure 10:
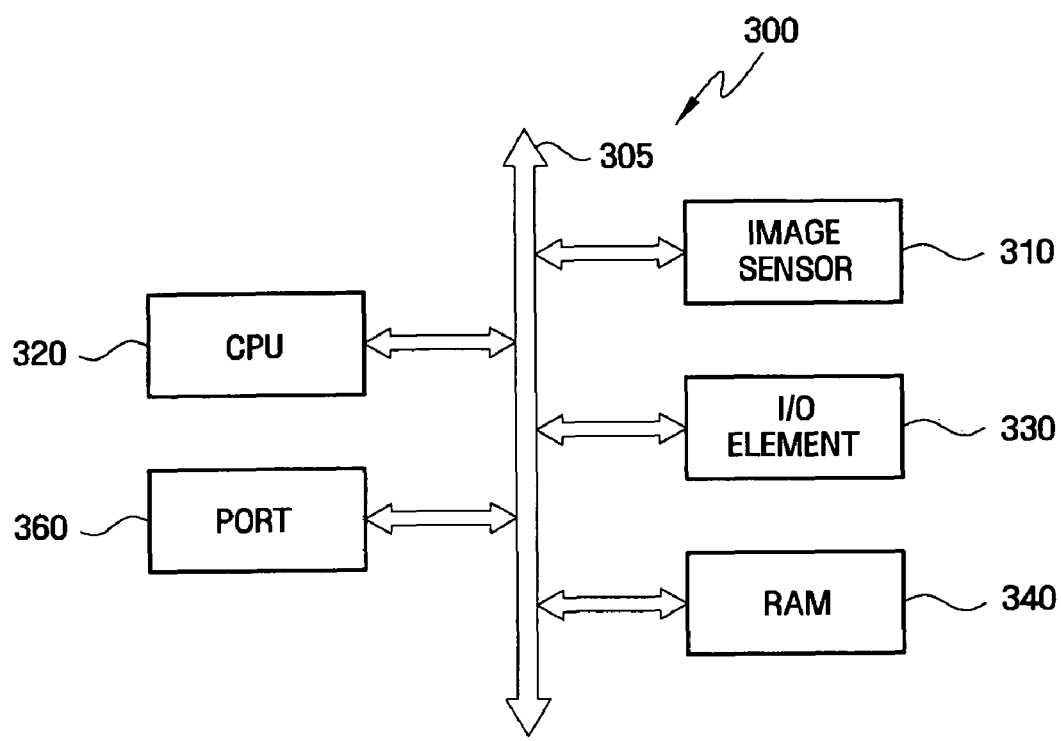
FIGS. 10 through 12 are diagrams illustrating processor-based apparatuses including an image sensor according to example embodiments of the present invention.
Figure 11A:
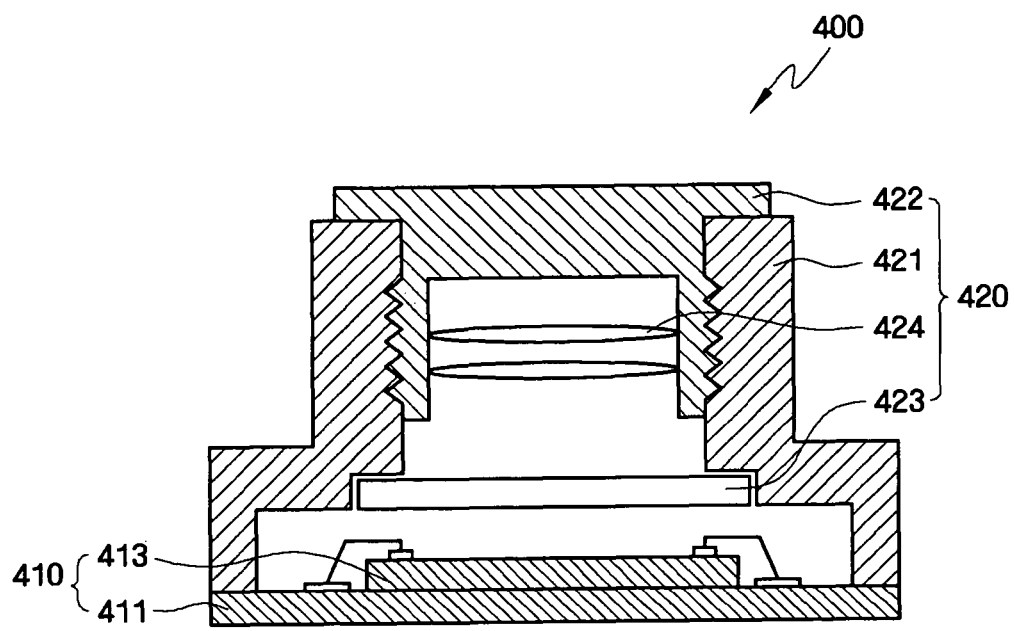
Figure 11B:
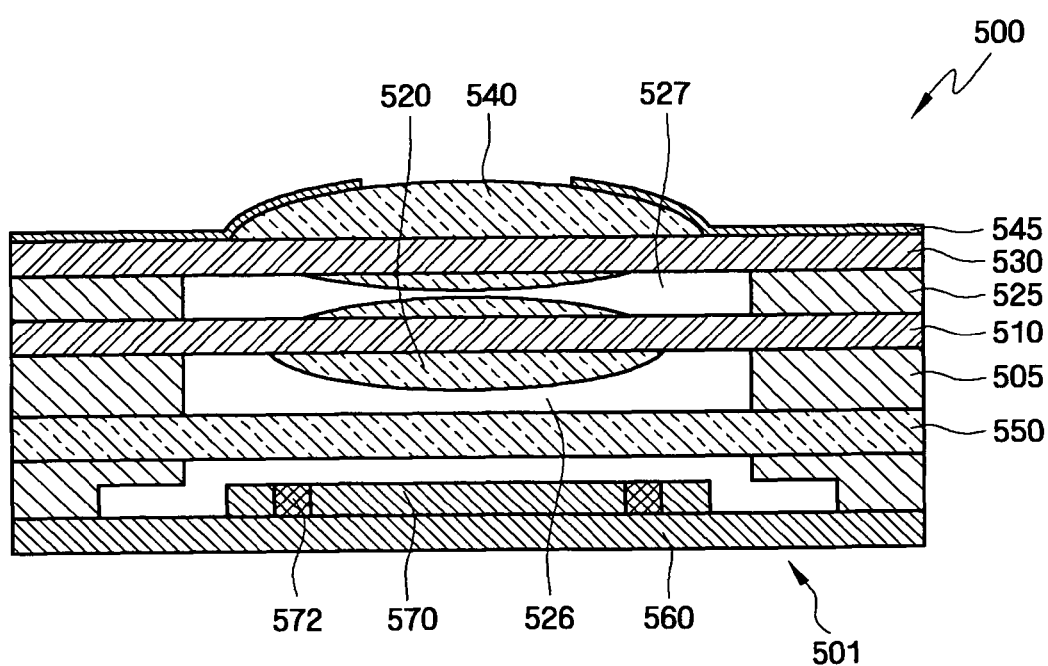
Figure 12:
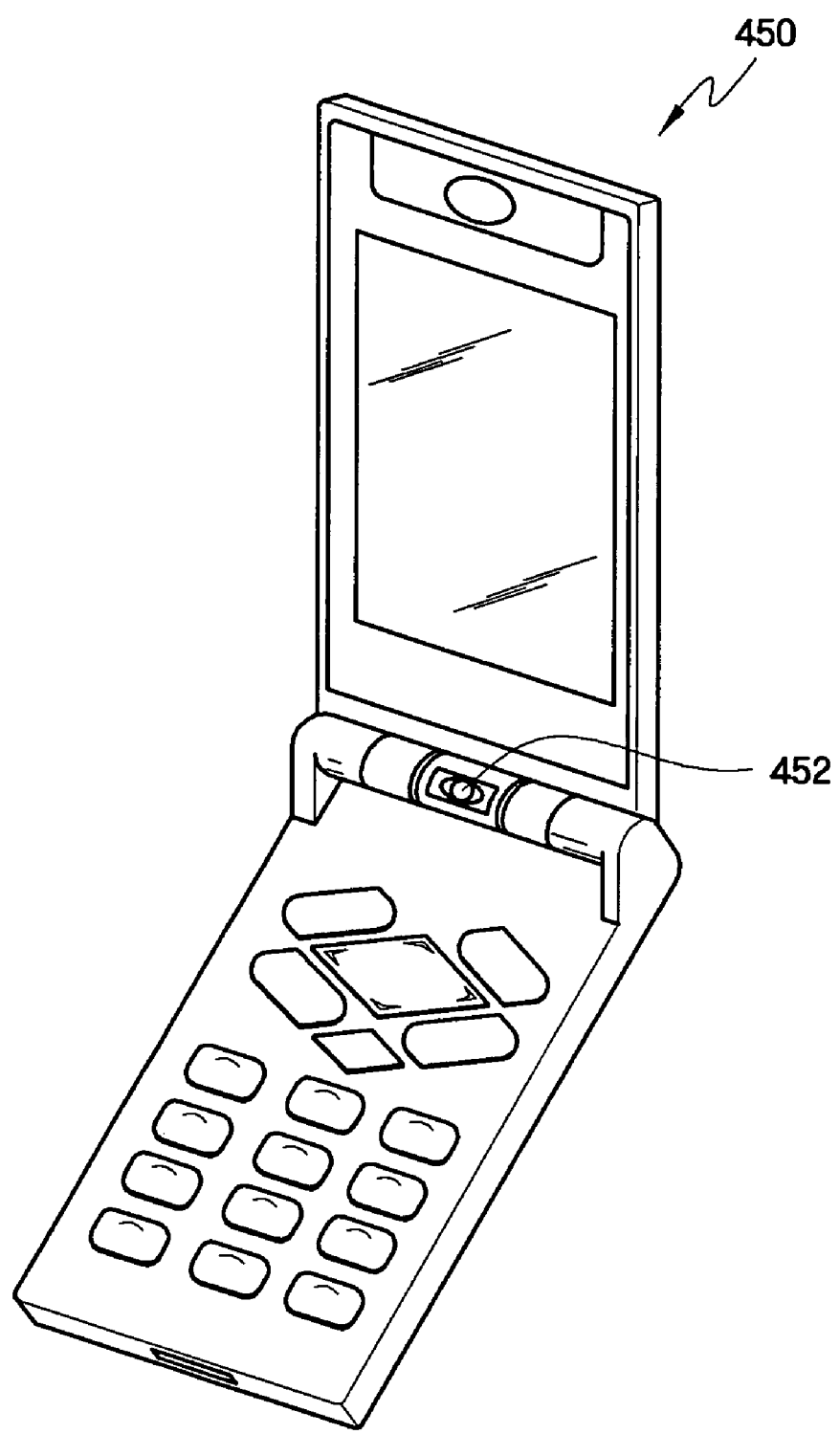

Hereinafter, apparatuses using an image sensor according to example embodiments of the present invention will be described with reference to FIGS. 9 through 12. FIG. 9 is a block diagram of a chip 200 which embodies an image sensor according to example embodiments of the present invention. FIGS. 10 through 12 are diagrams illustrating processor-based apparatuses including an image sensor according to example embodiments of the present invention. Specifically, FIG. 10 illustrates a computer 300, FIGS. 11A and 11B illustrate cameras 400 and 500, and FIG. 12 illustrates a mobile phone 450. It is obvious to those of ordinary skill in the art that an image sensor according to example embodiments of the present invention can be used in apparatuses (such as scanners, mechanized clock apparatuses, navigation apparatuses, videophones, surveillance apparatuses, automatic focusing apparatuses, tracking apparatuses, motion detection apparatuses, and image stabilization apparatuses) other than the above apparatuses.

Referring to FIG. 9, the chip 200 which embodies an image sensor according to example embodiments of the present invention includes a sensor array 210 composed of pixels which include light sensing elements and are arranged two-dimensionally, a timing generator 220, a row decoder 230, a row driver 240, a correlated double sampler (CDS) 250, an analog-to-digital converter (ADC) 260, a latch 270, and a column decoder 280.

The sensor array 210 includes a plurality of unit pixels that are arranged two-dimensionally. The unit pixels convert an optical image into an electrical signal. The sensor array 210 is driven by a plurality of driving signals (such as a row selection signal, a reset signal, and a charge transfer signal) transmitted from the row driver 240. In addition, the sensor array 210 transmits the electrical signal to the CDS 250 via a vertical signal line. The timing generator 220 provides a timing signal and a control signal to the row decoder 230 and the column decoder 280.

The row driver 240 transmits a plurality of driving signals for driving the unit pixels to the sensor array 210 based on the decoding result of the row decoder 230. When the unit pixels are arranged in a matrix form, the row driver 240 may transmit a driving signal to each row of unit pixels. The CDS 250 receives the electrical signal from the sensor array 210 via the vertical signal line and holds and samples the received electrical signal. That is, the CDS 250 samples a noise level and a signal level of the electrical signal and outputs the difference between the noise level and the signal level of the electrical signal.

The ADC 260 converts an analog signal, which corresponds to the difference between the noise level and the signal level of the electrical signal, into a digital signal and outputs the digital signal. The latch 270 latches the digital signal. Latched signals are sequentially provided to an image signal processor (not shown) based on the decoding result of the column decoder 280. All functional blocks illustrated in FIG. 9 may be formed as one chip or a plurality of chips. For example, the timing generator 220 may be formed as a separate chip, and the other chips may be integrated into a single chip. Also, these chips may be implemented in the form of a package.

Referring to FIG. 10, the computer 300 includes a central processing unit (CPU) 320 (e.g., a microprocessor) which can communicate with an input/output element 330 via a bus 305. An image sensor 310 may communicate with other components of the computer 300 through the bus 305 or any other telecommunication link. The computer 300 may further include a random access memory (RAM) 340 and/or a port 360 which can communicate with the CPU 320 through the bus 305. The port 360 may allow a video card, a sound card, a memory card, or a universal serial bus (USB) element to be coupled to the computer 300 and allow the computer 300 to perform data communication with other apparatuses. The image sensor 310 may be integrated together with the CPU 320, a digital signal processor (DSP), or a microprocessor. Also, the image sensor 310 may be integrated together with a memory. When necessary, the image sensor 310 and the microprocessor may be integrated on different chips.

Referring to FIG. 11A, the camera 400 includes an image sensor package 410 in which an image sensor 413 is mounted onto a circuit board 411 by bonding wires. In addition, a housing 420 is attached onto the circuit board 411 and protects the circuit board 411 and the image sensor 413 from an external environment. An optical tube assembly 421, through which an image to be captured passes, may be formed in the housing 420. Also, a protective cover 422 may be installed at an outer end of the optical tube assembly 421, and an infrared-blocking and reflection-reducing filter 423 may be installed at an inner end of the optical tube assembly 421. Further, a lens 424 may be installed inside the optical tube assembly 421 and move along the screw thread of the optical tube assembly 421.

Referring to FIG. 11B, the camera 500 includes an image sensor package 501 which uses through vias 572. The through vias 572 enable an image sensor 570 and a circuit board 560 to electrically contact each other without wire bonding. A first lens 520, a second lens 540, lens components 526 and 527, support members 505 and 525, an aperture 545, transparent substrates 510 and 530, and a pane of glass 550 shown in FIG. 11B will not be described. Referring to FIG. 12, an image sensor 452 is attached to a predetermined or given position on the mobile phone 450. It is obvious to those of ordinary skill in the art that the image sensor 452 can also be attached to positions other than the position shown in FIG. 12.

Hereinafter, a method of fabricating the image sensor 1 according to the example embodiment of the present invention will be described with reference to FIGS. 13 through 17. FIGS. 13 through 17 are views for explaining processes included in the method of fabricating the image sensor 1 according to the example embodiment of the present invention.

Figure 13:
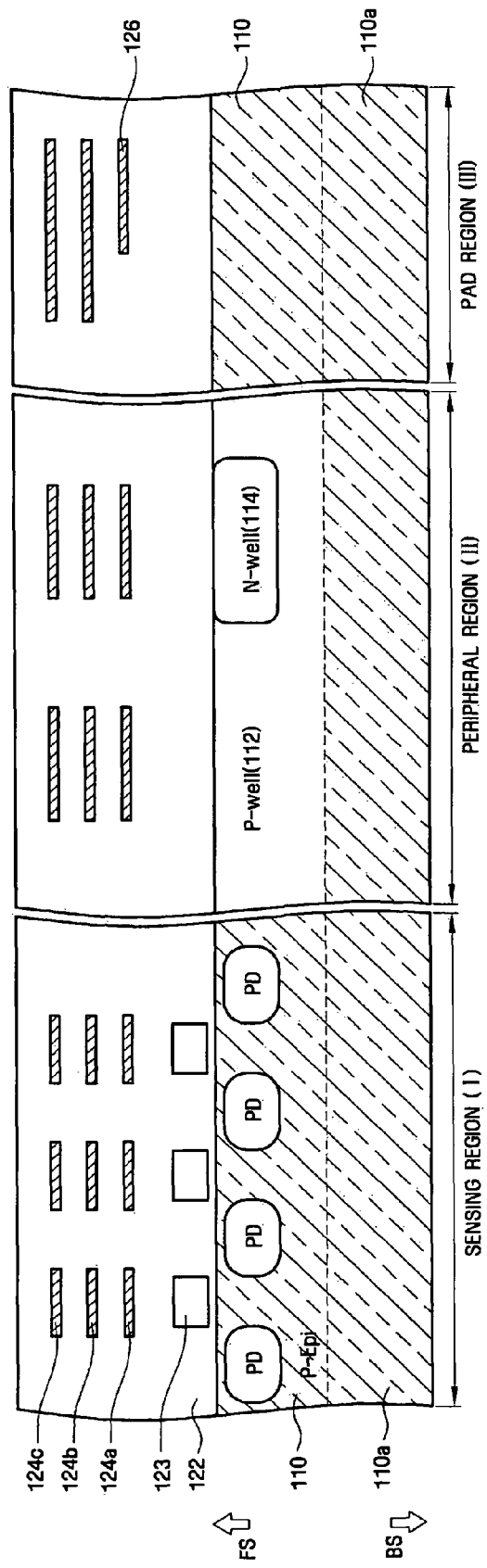
FIGS. 13 through 17 are views for explaining processes included in a method of fabricating the image sensor according to an example embodiment of the present invention.

Referring to FIG. 13, element isolation regions (not shown), such as shallow trench isolation (STI) regions or deep trench isolation (DTI) regions, are formed in the substrate 110 and 110a to define the sensing region I, the peripheral region II, and the pad region III. The substrate 110a may be a P- or N-type bulk substrate, and the substrate 110 may be a P- or N-type epitaxial layer formed on the bulk substrate 110a.

A plurality of pixels is formed in the sensing region I. Specifically, the photoelectric conversion elements, e.g., photodiodes PDs, are formed in the sensing region I, and the gates 123 are formed in the sensing region I. Each of the gates 123 may be a gate of a charge transmission element, a gate of a reset element, or a gate of a drive element.

The first well 112 of the first conductivity type (e.g., a P type) and the second well 114 of the second conductivity type (e.g., an N type) may be formed in the peripheral region II. The positions, shapes, and concentrations of the first and second wells 112 and 114 may vary. The wiring structure is formed on the front side FS of the substrate 110. Specifically, the wiring structure includes the interlayer insulating films 122, the wiring layers 124a through 124c which are formed in the sensing region I and are sequentially stacked, and the auxiliary pad 126 which is formed in the pad region III.

Figure 14:
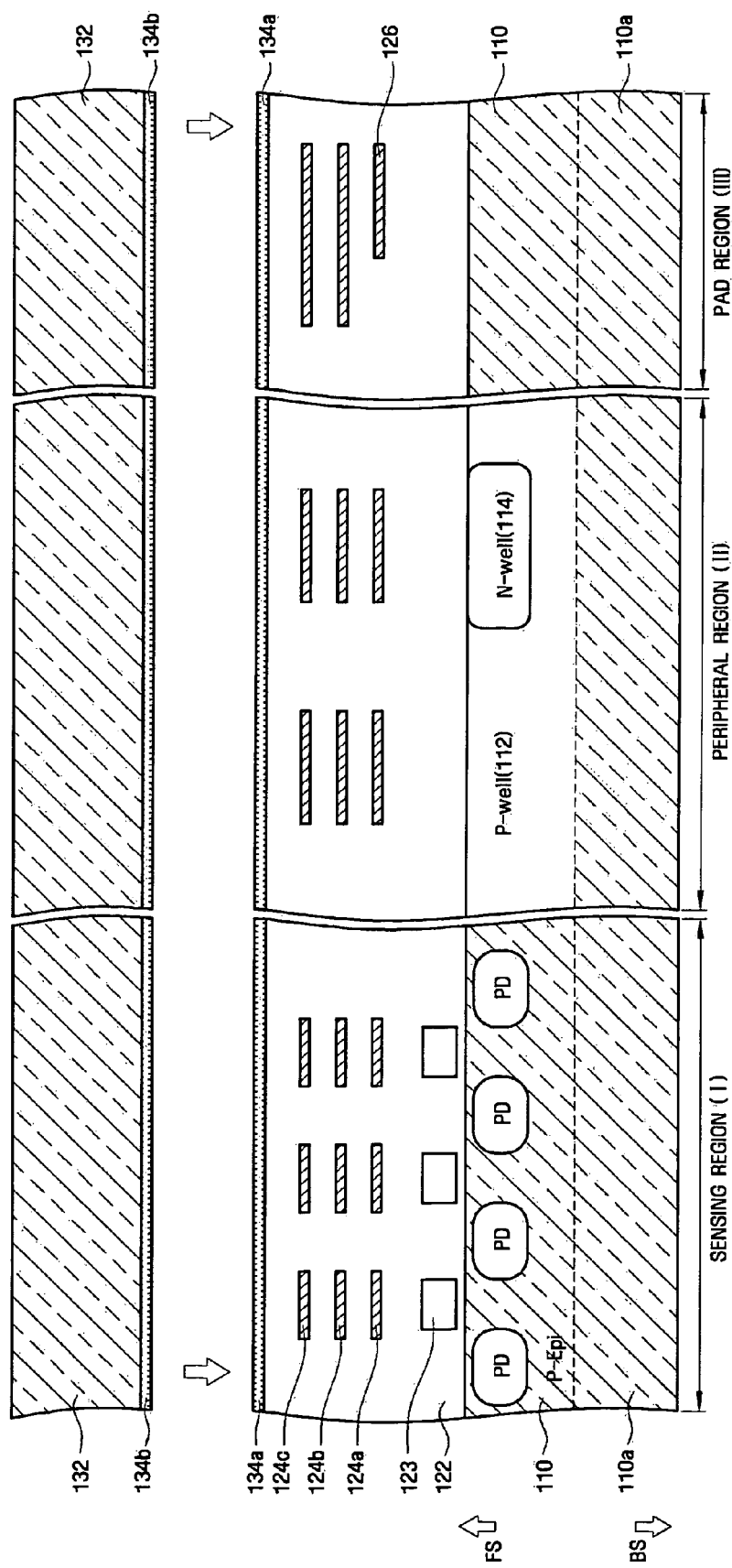

Referring to FIG. 14, the support substrate 132 is bonded onto the wiring structure. Specifically, the first adhesive film 134a is formed on the wiring structure and planarized. In addition, the second adhesive film 134b is formed on the support substrate 132. The support substrate 132 is bonded to the substrate 110 such that the first and second adhesive films 134a and 134b face each other.

Figure 15:
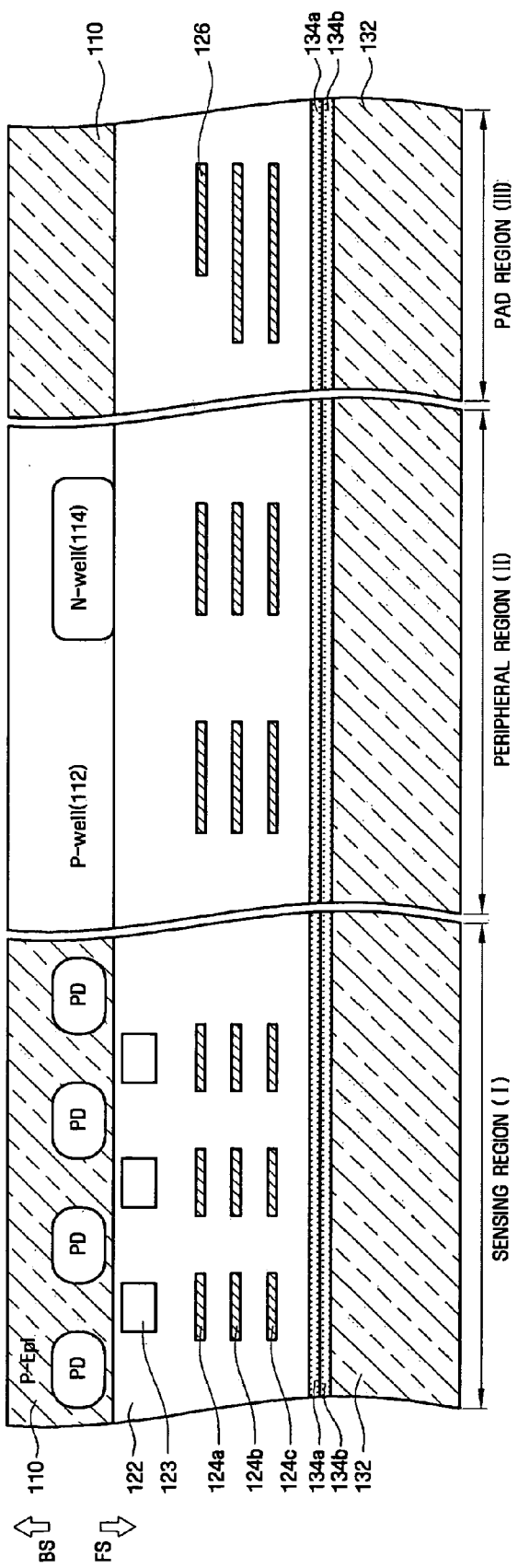

Referring to FIG. 15, the substrate 110 to which the support substrate 132 is bonded is turned over. The backside BS of the substrates 110 and 110a is ground. Specifically, the backside BS of the substrates 110 and 110a is ground by chemical mechanical polishing (CMP), back grinding (BGR), reactive ion etching, or a combination of the same. Here, the bulk substrate 110a may be ground and removed. However, the present invention is not limited thereto. For example, part of the bulk substrate 110a may not be removed.

Figure 16:
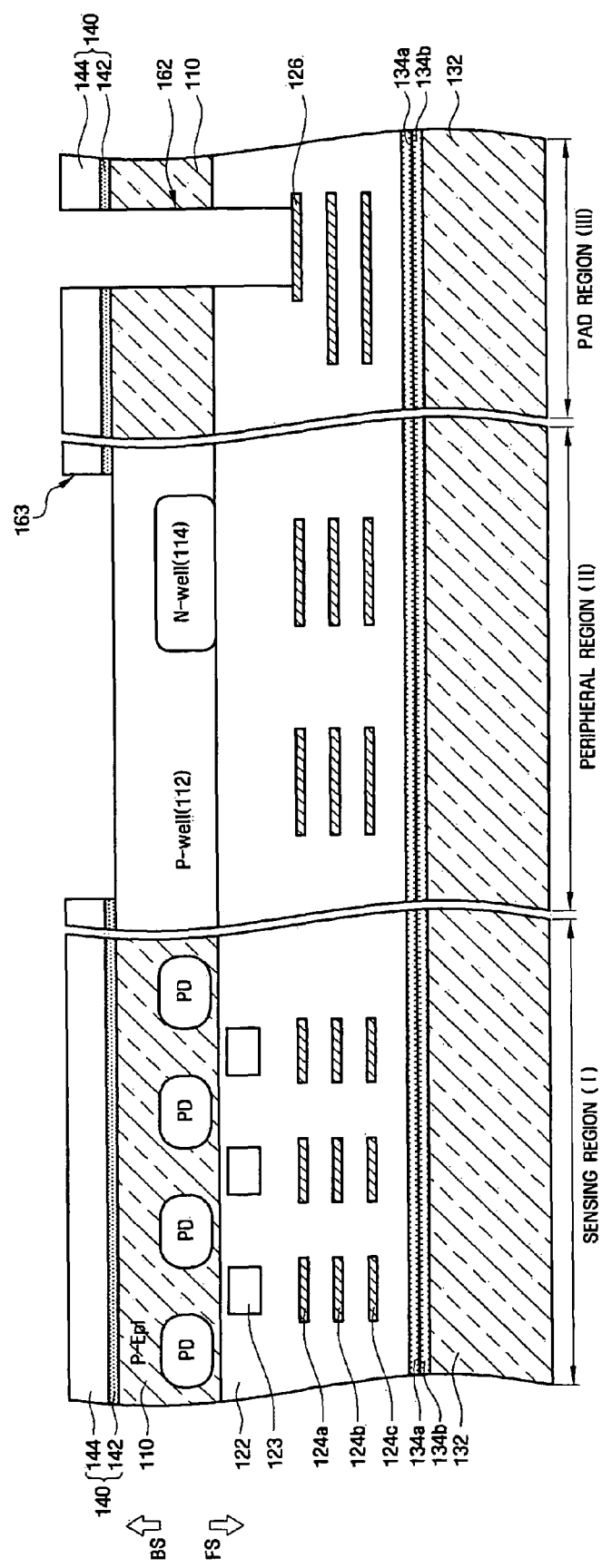

Referring to FIG. 16, the backside insulating film 140 is formed on the backside BS of the substrate 110. The contact hole 162, which penetrates the backside insulating film 140 and the substrate 110 to expose the auxiliary pad 126, is formed in the pad region III. The trench 163, which exposes at least part of the backside BS of the substrate 110, is formed in the peripheral region II by patterning the backside insulating film 140.

Figure 17:
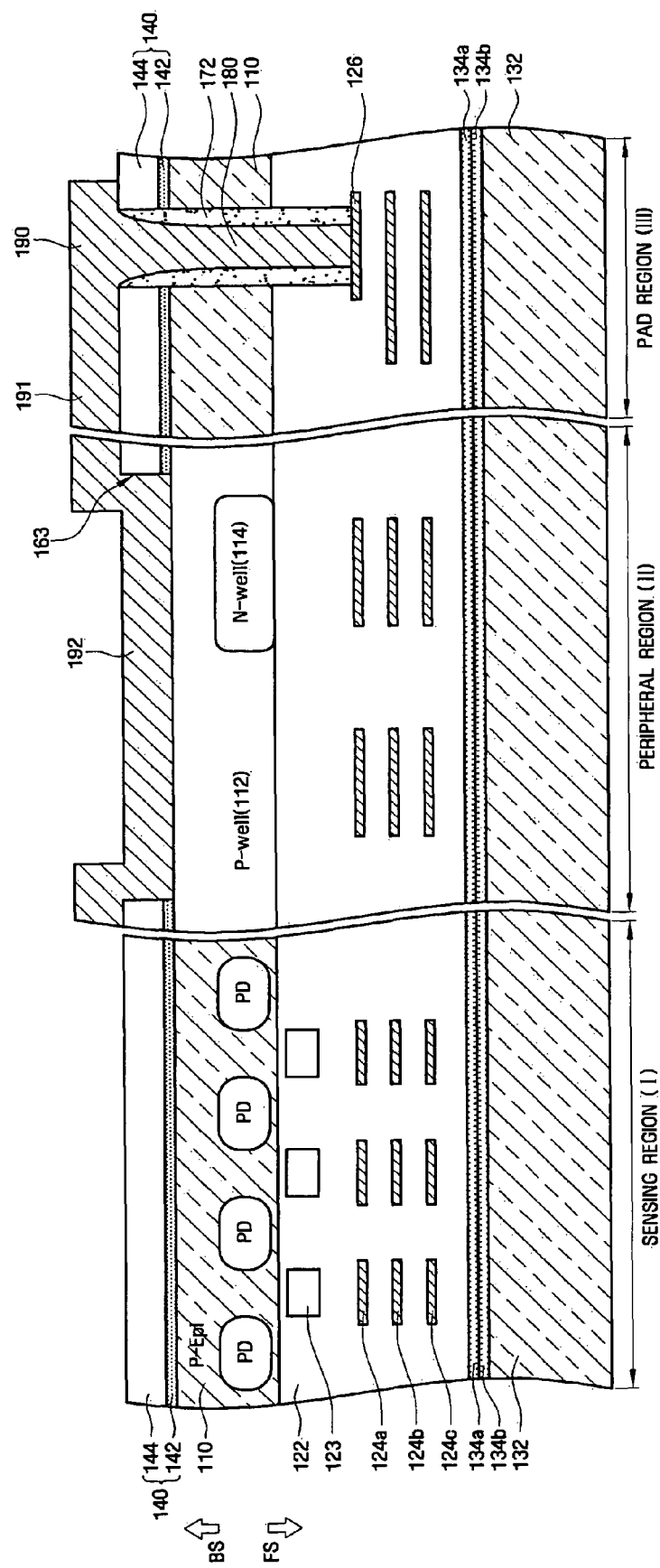

Referring to FIG. 17, the spacer 172 is formed on the sidewalls of the contact hole 162. Although not shown in the drawing, when the spacer 172 is formed on the sidewalls of the contact hole 162, the spacer 172 may also be formed on sidewalls of the backside insulating film 140. The contact 180, which is electrically connected to the auxiliary pad 126, is formed in the contact hole 162. The first pads 190, each of which is electrically connected to the contact 180, are formed on the substrate 110 in the pad region III, and the first metal wiring layer 192, which directly contacts the backside BS of the substrate 110 in the peripheral region II, is formed. The first metal wiring layer 192 and each of the first pads 190 may be connected to each other by a connection portion 191.

Referring back to FIG. 2, the color filters 197 and the microlenses 198 are sequentially formed in the sensing region I. The color filters 197 and the microlenses 198 are formed at locations corresponding to the photoelectric conversion elements (e.g., photodiodes PDs). Although not shown in the drawing, a planarization film may be formed between the color filters 197 and the microlenses 198 or under the color filters 197.

Methods of fabricating the image sensors 2 through 4 can be inferred from the above-described method of fabricating the image sensor 1 according to the example embodiment of the present invention by those of ordinary skill in the art to which the present invention pertains.

While the present invention has been particularly shown and described with reference to example embodiments thereof, it will be understood by those of ordinary skill in the art that various changes in form and detail may be made therein without departing from the spirit and scope of the present invention as defined by the following claims. Example embodiments should be considered in a descriptive sense only and not for purposes of limitation.

What is claimed is:

1. An image sensor comprising:
   a substrate;
   a wiring structure formed on a front side of the substrate and including a plurality of wiring layers and a plurality of insulating films;
   a first well formed within the substrate and having a first conductivity type; and
   a first metal wiring layer directly contacting a backside of the substrate and configured to apply a first well bias to the first well.

2. The image sensor of claim 1, wherein the substrate comprises a sensing region including a plurality of unit pixels, a peripheral region including a circuit for controlling the unit pixels, and a pad region, wherein the first metal wiring layer directly contacts the backside of the substrate in the peripheral region.

3. The image sensor of claim 2, further comprising:
   a backside insulating film formed on the backside of the substrate and including a trench exposing at least part of the backside of the substrate in the peripheral region, wherein the first metal wiring layer is conformally formed along a top surface and sidewalls of the backside insulating film and a portion of the backside of the substrate exposed by the trench.

4. The image sensor of claim 2, further comprising:
   a backside insulating film formed on the backside of the substrate,
   wherein the backside of the substrate in the peripheral region is exposed by a plurality of through-holes, and the first metal wiring layer fills the through-holes.

5. The image sensor of claim 3, wherein the first metal wiring layer is electrically connected to a pad formed on the backside of the substrate in the pad region.

6. The image sensor of claim 5, wherein the wiring structure further comprises an auxiliary pad, wherein the pad and the auxiliary pad are electrically connected to each other by a contact which penetrates the backside insulating film and the substrate.

7. The image sensor of claim 4, wherein the first metal wiring layer is electrically connected to a pad formed on the backside of the substrate in the pad region.

8. The image sensor of claim 7, wherein the wiring structure further comprises an auxiliary pad, wherein the pad and the auxiliary pad are electrically connected to each other by a contact which penetrates the backside insulating film and the substrate.

9. The image sensor of claim 1, further comprising:
   a second well formed within the substrate and having a second conductivity type different from the first conductivity type; and a second metal wiring layer directly contacting the backside of the substrate, the second metal wiring layer separated from the first metal wiring layer, and configured to apply a second well bias, different from the first well bias, to the second well.

10. The image sensor of claim 1, further comprising:
a third well formed within the substrate and having the second conductivity type different from the first conductivity type, wherein the wiring structure includes a third metal wiring layer configured to apply a third well bias, different from the first well bias, to the third well.

11. The image sensor of claim 1, wherein the substrate is an epitaxial layer.

12. The image sensor of claim 1, further comprising:
a support substrate bonded onto the wiring structure.

13. An image sensor comprising:
a sensing region, a peripheral region, and a pad region defined within a substrate;
photoelectric conversion elements formed in the sensing region;
a first well formed in the peripheral region and having a first conductivity type;
a wiring structure formed on a front side of the substrate and including a plurality of wiring layers and a plurality of insulating films;
a first pad formed on a backside of the substrate in the pad region and receiving a first well bias; and
a first metal wiring layer formed on the backside of the substrate in the peripheral region and electrically connected to the first pad to deliver the first well bias from the first pad to the first well.

14. The image sensor of claim 13, wherein the first pad and the first metal wiring layer are connected to each other by a connection portion, and the connection portion extends from the first pad to directly contact the first metal wiring layer.

15. The image sensor of claim 13, further comprising:
a second well formed in the peripheral region and having a second conductivity type different from the first conductivity type;
a second pad formed on the backside of the substrate in the pad region and receiving a second well bias; and
a second metal wiring layer formed on the backside of the substrate in the peripheral region and electrically connected to the second pad to deliver a second well bias from the second pad to the second well.

16. The image sensor of claim 13, further comprising:
a third well formed in the peripheral region and having the second conductivity type different from the first conductivity type, wherein the wiring structure includes a third metal wiring layer configured to apply a third well bias, different from the first well bias, to the third well.

17. The image sensor of claim 13, wherein the substrate is an epitaxial layer.

* * * * *